(12) United States Patent
Chai et al.

(10) Patent No.: US 11,257,663 B2
(45) Date of Patent: Feb. 22, 2022

(54) SPUTTERING SYSTEM AND METHOD

(71) Applicant: AGENCY FOR SCIENCE, TECHNOLOGY AND RESEARCH, Singapore (SG)

(72) Inventors: Jianwei Chai, Singapore (SG); Shijie Wang, Singapore (SG); Dongzhi Chi, Singapore (SG); Ming Yang, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 37 days.

(21) Appl. No.: 16/645,512

(22) PCT Filed: Sep. 11, 2018

(86) PCT No.: PCT/SG2018/050462
§ 371 (c)(1),
(2) Date: Mar. 9, 2020

(87) PCT Pub. No.: WO2019/050483
PCT Pub. Date: Mar. 14, 2019

(65) Prior Publication Data
US 2020/0279723 A1    Sep. 3, 2020

(30) Foreign Application Priority Data
Sep. 11, 2017    (SG) .............. 10201707414P

(51) Int. Cl.
*H01J 37/34*    (2006.01)
*C23C 14/34*    (2006.01)
(Continued)

(52) U.S. Cl.
CPC ........ *H01J 37/345* (2013.01); *C23C 14/3407* (2013.01); *C23C 14/3464* (2013.01);
(Continued)

(58) Field of Classification Search
None
See application file for complete search history.

(56) References Cited

U.S. PATENT DOCUMENTS 3,922,214 A * 11/1975 Van Cakenberghe ...................... C23C 14/228
204/298.41
5,370,778 A    12/1994  Koo et al.
(Continued)

FOREIGN PATENT DOCUMENTS

WO    WO-2016/013984 A1    1/2016

OTHER PUBLICATIONS

Written Opinion in SG Application No. 11202002076Q dated Sep. 1, 2020, 7 pages.
(Continued)

*Primary Examiner* — Jason Berman
(74) *Attorney, Agent, or Firm* — Marshall, Gerstein & Borun LLP

(57) ABSTRACT

A sputtering system and a sputtering method are provided. The sputtering system includes a first electrode, a magnet and a second electrode. The first electrode is an elongated tube having a first end and a second end downstream of the first end. The first end is configured to receive a gas flow and the second end is placed next to a substrate. The magnet surrounds at least a portion of the elongated tube and is configured to generate a magnetic field in a space within the elongated tube. The second electrode is disposed within the elongated tube. A voltage is configured to be applied between the first and second electrodes to generate an electric field between the first and second electrodes.

13 Claims, 5 Drawing Sheets

(51) Int. Cl.
*C23C 14/35* (2006.01)
*H01J 37/32* (2006.01)

(52) U.S. Cl.
CPC .......... *C23C 14/3478* (2013.01); *C23C 14/35* (2013.01); *H01J 37/32449* (2013.01); *H01J 37/3402* (2013.01); *H01J 37/3429* (2013.01); *H01J 37/3438* (2013.01); *H01J 2237/24564* (2013.01)

(56) References Cited

U.S. PATENT DOCUMENTS

| | | | |
|---|---|---|---|
| 6,251,242 | B1 | 6/2001 | Fu et al. |
| 6,337,001 | B1 | 1/2002 | Haag et al. |
| 2005/0023129 | A1 | 2/2005 | Kadokura et al. |
| 2005/0029088 | A1* | 2/2005 | Delahoy ............... C23C 14/228 204/192.12 |

OTHER PUBLICATIONS

Helmersson et al., "Ionized Physical Vapor Deposition (IPVD): A Review of Technology and Applications", vol. 513, Aug. 14, 2006, 24 pages.

International Search Report and Written Opinion in International Application No. PCT/SG2018/050462 dated Nov. 29, 2018, 8 pages.

Second Written Opinion in SG Application No. 11202002076Q dated Jul. 28, 2021, 6 pages.

\* cited by examiner

SPUTTERING SYSTEM AND METHOD

FIELD OF INVENTION

The present invention relates broadly, but not exclusively, to sputtering systems and methods.

BACKGROUND

Sputtering is a process in which particles in a solid target material are ejected from its surface due to bombardment by energetic particles. Sputtering has been used in various industries to deposit thin films onto a substrate.

In optoelectronics and valleytronics, it has observed that the transition metal based two-dimensional materials such as molybdenum disulfide ($MoS_2$) and tungsten disulfide ($WS_2$) exhibit promising applications.

Based on the above understanding, WO 2016/013984 A1 describes a deposition process to synthesize wafer-scale $MoS_2$ atomic layers on diverse substrates via magnetron sputtering, which enables large-area deposition of transition metal dichalcogenide films in a controllable way. Films can be grown by a layer-by-layer mode with good uniformity and over large areas. The method can be further scaled up to a large area sample for industry applications. In this way, it is compatible with industry mass production techniques on wafer level.

However, due to the bombardment effect on the surface of the grown sample during sputtering process, a higher defect density has been seen in the thin films. In other words, a shortcoming of the above approach is that bombardment damage to the film surface is expected to be high.

A need therefore exists to provide a sputtering system and method that seek to address at least some of the above problems.

SUMMARY

An aspect of the present disclosure provides a sputtering system comprising: a first electrode comprising an elongated tube having a first end and a second end downstream of the first end, wherein the first end is configured to receive a gas flow and the second end is placed next to a substrate; a magnet surrounding at least a portion of the elongated tube and configured to generate a magnetic field in a space within the elongated tube; and a second electrode disposed within the elongated tube. A voltage is configured to be applied between the first and second electrodes to generate an electric field between the first and second electrodes.

The first electrode may comprise a cathode and the second electrode may comprise an anode. Alternatively, the first electrode may comprise an anode and the second electrode may comprise a cathode.

The first and second electrodes may be made of the same material. Alternatively, the first and second electrodes may be made of different materials.

At least one of the first and second electrodes may be made of a transition metal, and the gas flow may comprise a chalcogen vapor.

The transition metal may comprise Molybdenum or Tungsten.

The tube may be substantially cylindrical and the second electrode may comprise a rod disposed along a longitudinal axis of the tube.

The system may further comprise control means for controlling at least one of a partial pressure of the gas flow, a strength of the magnetic field, a strength of the electric field, a sputtering duration, and a temperature of the substrate.

Another aspect of the present disclosure provides a sputtering method. The method comprises providing a sputtering system, generating a sputtered material, and depositing the generated sputtered material exiting the second end of the elongated tube onto the substrate. The sputtering system comprises a first electrode comprising an elongated tube having a first end and a second end downstream of the first end, wherein the second end is disposed adjacent a substrate; a magnet surrounding at least a portion of the elongated tube; and a second electrode disposed within the elongated tube. Generating the sputtered material comprises: generating a magnetic field in a space within the elongated tube using the magnet; applying a voltage between the first and second electrodes to generate an electric field between the first and second electrodes; and supplying a gas flow to the first end of the elongated tube to generate a discharge.

Applying the voltage between the first and second electrodes may comprise using the first electrode as a cathode and the second electrode as an anode. Alternatively, applying the voltage between the first and second electrodes may comprise using the first electrode as an anode and the second electrode as a cathode. The method may further comprise alternating a direction of the electric field between the first and second electrodes.

Providing the sputtering system may comprise selecting the first and second electrodes to be of the same material. Alternatively, providing the sputtering system may comprise selecting the first and second electrodes to be of different materials.

Providing the sputtering system may further comprise selecting at least one of the first and second electrodes to be made of a transition metal, and supplying the gas flow may comprise supplying a chalcogen vapor in the gas flow.

The transition metal may comprise Molybdenum or Tungsten.

Providing the sputtering system may further comprise providing a substantially cylindrical tube and disposing a rod along a longitudinal axis of the tube.

The method may further comprise controlling at least one of a partial pressure of the gas flow, a strength of the magnetic field, a strength of the electric field, a sputtering duration, and a temperature of the substrate.

Depositing the generated sputtered material may comprise depositing the material as a two-dimensional (2D) film.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

The example embodiments provide a sputtering system and method based on sputtering and evaporation, which can grow large scale two-dimensional (2D) films or other thin films with less surface damage and in a more controllable manner. As a result, the quality of the deposited 2D film can be improved. For example, in example implementations, ultra-flat and uniform $MoS_2$ and $WS_2$ thin layers have been realized.

Figure 1:
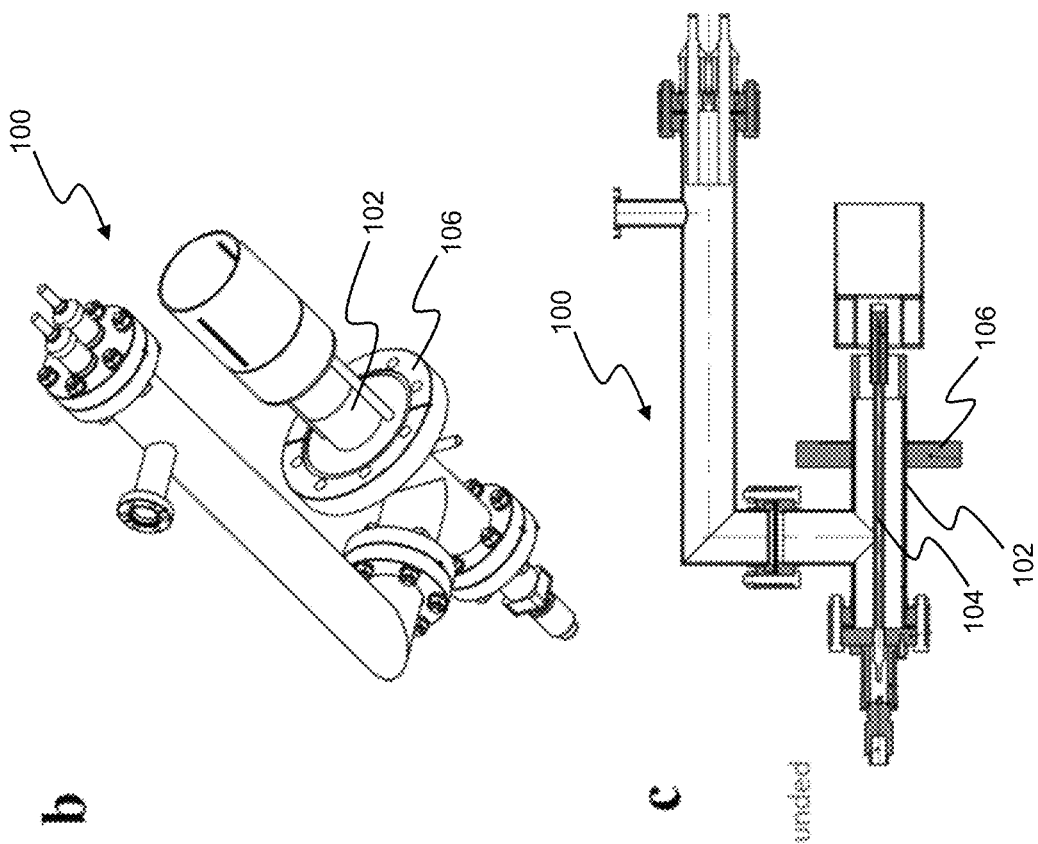
FIG. 1 shows various views of the sputtering system according to an example embodiment.
Figure 1:
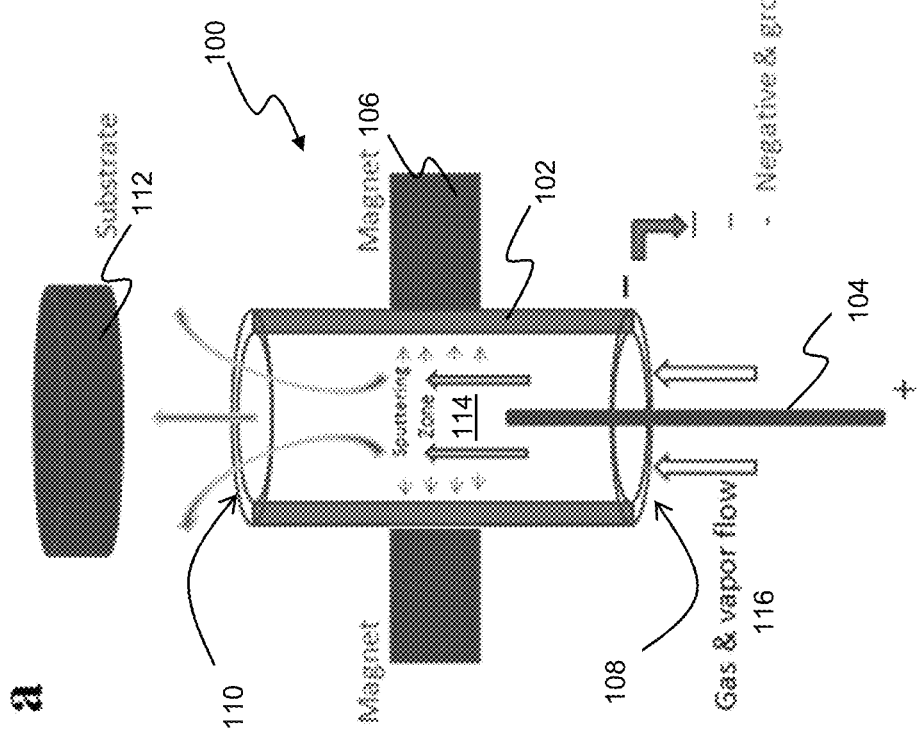

FIG. 1 shows various views of a sputtering system 100 according to an example embodiment. Specifically, FIG. 1a shows a schematic diagram of the system 100, FIG. 1b shows a perspective view of one implementation of the system 100, and FIG. 1c shows a cross-sectional view of the implementation in FIG. 1b. Like reference numerals and characters in the drawings refer to like elements or equivalents.

The sputtering system 100 includes a first electrode 102, a second electrode 104 and a magnet 106. The first electrode 102 is in the form of an elongated tube having a first end 108 and a second end 110 downstream of the first end 108. A substrate 112 is placed next to the second end 110 of the elongated tube such that at least some of the particles exiting the tube can strike the substrate 112 with low energy. The magnet 106 surrounds at least a portion of the elongated tube, while the second electrode 104 is disposed within the elongated tube.

In the present example, the elongated tube forming the first electrode 102 is substantially cylindrical and the second electrode 104 is in the form of a rod disposed along a longitudinal (e.g. central) axis of the tube. However, it will be appreciated that the elongated tube may have a different shape or geometry in alternate embodiments while still being hollow. For example, the elongated tube may have an elliptical or polygonal cross-section and the second electrode 104 can be adapted accordingly.

As depicted in FIG. 1a, the first electrode 102 is used as a cathode (i.e. negative electrode), while the second electrode 104 is used as an anode (i.e. positive electrode). Alternatively, the first electrode 102 can be used as an anode, while the second electrode 104 can be used as a cathode. Further, as described in further details below, for this conductive tube, the polarity of the first electrode 102 and second electrode 104 may be reversed in use, thereby alternating the direction of an electric field generated between the first electrode 102 and second electrode 104.

When used as the cathode, the first electrode 102 is typically made of a target material, such as a transition metal. Non-limiting examples of suitable transition metals include Molybdenum (Mo) and Tungsten (W). The first electrode 102 and second electrode 104 may be made of the same material (e.g. Tungsten for both), which can result in less cross-contamination during sputtering than that in a conventional sputtering process. Alternatively, the first electrode 102 and second electrode 104 may be made of different materials (e.g. Tungsten for one and Molybdenum for the other). When used in a sputtering process where the direction of the applied electric field is reversed, alternating layers of different materials may be deposited onto the substrate, as will be further described below.

While not specifically depicted in FIG. 1, the system 100 also includes control means to control at least one parameter of the sputtering process. Examples of such parameters include, but are not limited to, a partial pressure of the gas flow, a strength of the magnetic field, a strength of the electric field, a sputtering/deposition duration, and a temperature of the substrate. By controlling at least one of these parameters, a desired result can be achieved based on the materials used.

With reference to FIG. 1a, an example use of the sputtering system 100 to grow a thin layer or film of a target material on the substrate 112 is now described.

The magnet 106, which can be a permanent magnet or an electromagnet, surrounds a portion of the first electrode 102 and provides a relatively strong magnetic field in a space called the sputtering zone 114 within the elongated tube forming the first electrode 102. The first electrode 102 is applied with negative voltage and grounded. The second electrode 104 is applied with a positive high voltage. Thus, an electric field pointing to the wall of the elongated tube can be generated between second electrode 104 and first electrode 102. A gas flow 116 comprising, for example, a working gas such as argon (Ar) and a chalcogen such as sulfur (S) vapour, is supplied to the first end 108 of the elongated tube to generate a discharge. For example, a discharge will happen if the flow rate, applied voltage and distance between the second electrode 104 and first electrode 102 meet with the Paschen's Law. The magnetic field generated by the magnet 106 can enhance collisions among electrons, ions and particles in the plasma and also confine charged ions and electrons. The positive charges like $Ar^+$ from the working gas are attracted by the negatively-charged tube wall under influence of such electric field. This makes the sputtering process only happen in the inner wall of the elongated tube, and most of the plasma and sputtered materials are confined in the hollow elongated tube.

The sputtered material leaving the second end 110 of the elongated tube strikes the surface of the substrate 112 and become deposited onto the surface. If the target material is a transition metal and the gas flow includes a chalcogen, deposition of a transition metal dichalcogenide film onto the substrate 112 can be achieved.

In the sputtering system and method as described above, unlike conventional sputtering systems with a structure of two parallel plates, an elongated tube and internal rod are used as electrodes to confine the plasma inside the tube with a high aspect ratio (length vs diameter). Due to the confinement of the plasma and high aspect ratio, the ions or atoms diffuse out from tube have multiple collisions, and reach the substrate at a low energy. Thus, surface damage due to particle bombardment can be reduced, unlike conventional sputtering with significant damage effect during growth. Also, due to the narrow gap between tube and internal electrode, the flux of out-diffused species can be significantly reduced, thus making it possible to realize a lower growth (i.e. deposition) rate, which may be ideal for monolayer growth or 2D growth of a few layers. The sputtering system according to the example embodiments can also provide differential pumping, where the pressure in the elongated tube is one or two order higher than that in the deposition chamber. Thus, the deposition chamber can maintain a high vacuum (e.g. above $10^{-6}$ Torr).

Further, it has been observed that the thin films grown by the sputtering system and method according to the example embodiments have several notable features. For example, less surface damage is caused to the deposited films because most of the sputtered materials are confined in the tube, and only those with glancing angle can exit the tube and such particles are much less energetic than those with bigger angles. Moreover, the target material ejected to the opposite wall within the tube may be re-sputtered again and again, thus the particle size may be refined under such grinding effect. Preferably, the deposited films can be more uniform and homogeneous. As discussed above, a low deposition rate can be achieved with the confinement effect, and it may be easier to control concentration of deposited films which can be beneficial to 2D film or ultrathin multilayer film growth. If the applied voltage is reversed, the sputtering process happens on the second electrode 104 (rod) instead of on the first electrode 103 (tube wall), thus realizing a kind of point sputtering source. This may provide in-situ growth of not only multilayer ultra-thin films but also 2D van der Waals heterostructures with much less complicated processes in one sputtering gun.

Figure 2:
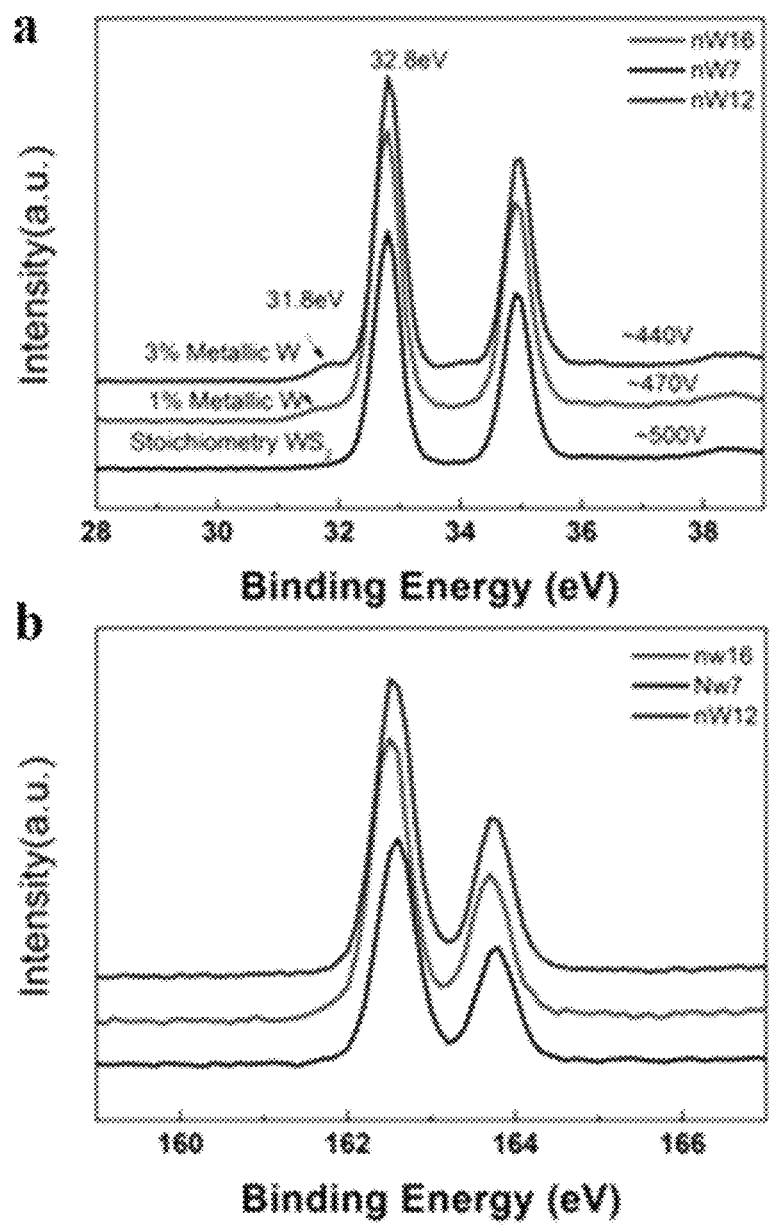
FIG. 2 shows example X-ray photoemission spectroscopy (XPS) spectra of a film grown using the system of FIG. 1.

FIG. 2 shows example X-ray photoemission spectroscopy (XPS) spectra of a film grown using the system 100 of FIG. 1 under the controlled growth conditions. FIG. 2a shows the W4f spectra, while FIG. 2b shows the S2p spectra. These spectra suggest the formation of stoichiometric $WS_2$ films on the $SiO_2$ substrate in one implementation. The sharp and symmetric core-level peaks indicate the good crystalline quality of the grown $WS_2$ films. It is also possible to grow sub-stoichiometric $WS_{2-x}$ films and control the concentration of W sub-oxidation states in the films as shown in FIG. 2. For example, with the fixed partial pressure of S vapour gas ($3.0 \times 10^{-5}$ mbar), substrate temperature of 700° C., a deposition time of 60 minutes, the concentration of W sub-oxidation states can be tuned from 3% to 1% by controlling the partial pressure of Ar gas, in which the corresponding applied voltage is changed from 430 V to 450 V. When the applied voltage is increased to 500 V, it is possible to obtain stoichiometric $WS_2$ films. It is noted that stoichiometric $WS_2$ films have promising applications in electronic and optoelectronic devices, and metallic $WS_2$ films may have potential application as a photocatalyst, e.g. in hydrogen evolution reaction.

Figure 3:
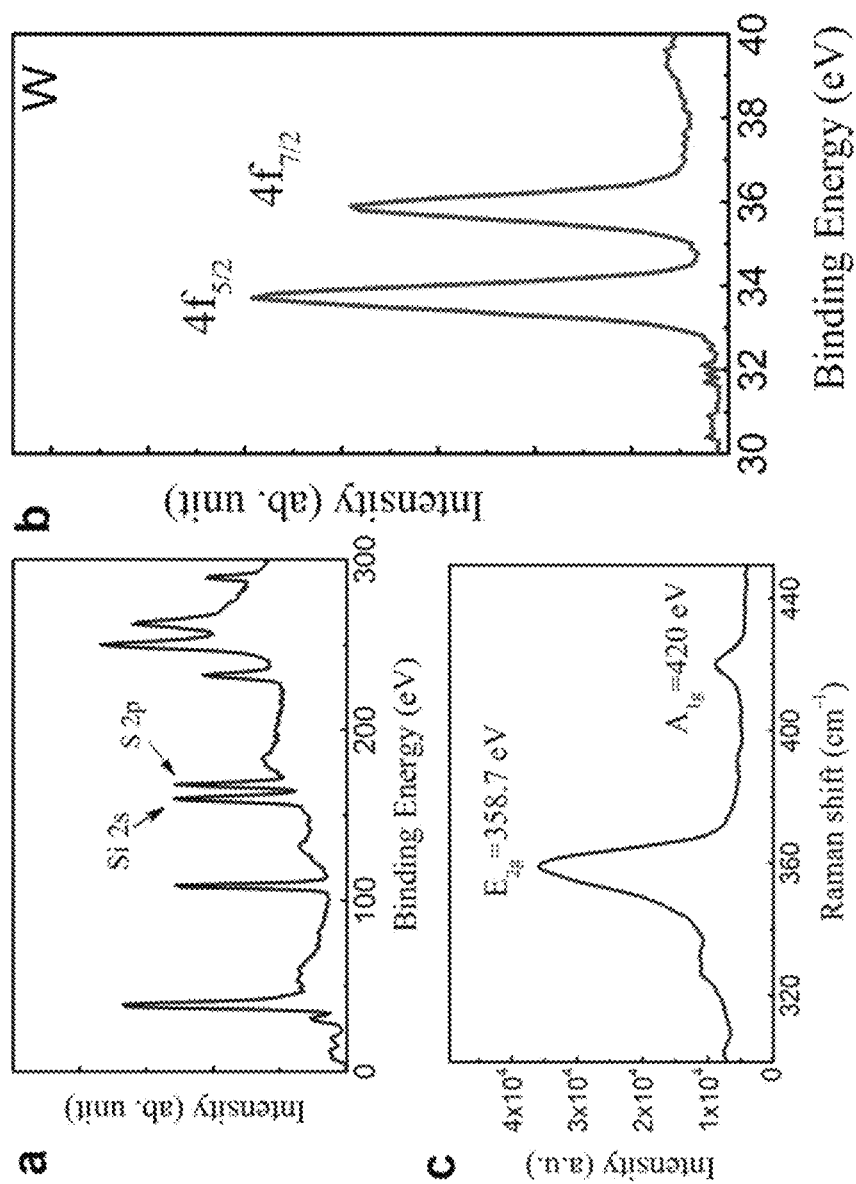
FIG. 3 shows analytical results of a $WS_2$ monolayer grown using the system of FIG. 1 on a $SiO_2$ substrate.

FIG. 3 shows analytical results of a $WS_2$ monolayer grown using the system 100 of FIG. 1 on a $SiO_2$ substrate. The growth of a $WS_2$ monolayer on the $SiO_2$ substrate can be realised in one implementation by controlling the deposition time and the partial pressure of Ar gas. FIG. 4a provides the XPS survey peak of the grown $WS_2$ film, from which the thickness of the $WS_2$ film is estimated to be one monolayer by comparing the ratio between Si 2s and S 2p peaks. From the W 4f core-level peaks in FIG. 4b, there are no sub-oxidation states found, suggesting a stoichiometric $WS_2$ film. The relative Raman shift between $A_{1g}$ and $E_{2g}$ peaks is about 61.3 $cm^{-1}$, as shown in FIG. 4c, very close to that of chemical vapour deposition (CVD) grown $WS_2$ monolayer (~61.5 $cm^{-1}$). This result further confirms the good quality of the $WS_2$ film deposited by the sputtering system and method according to the example embodiments.

Figure 4:
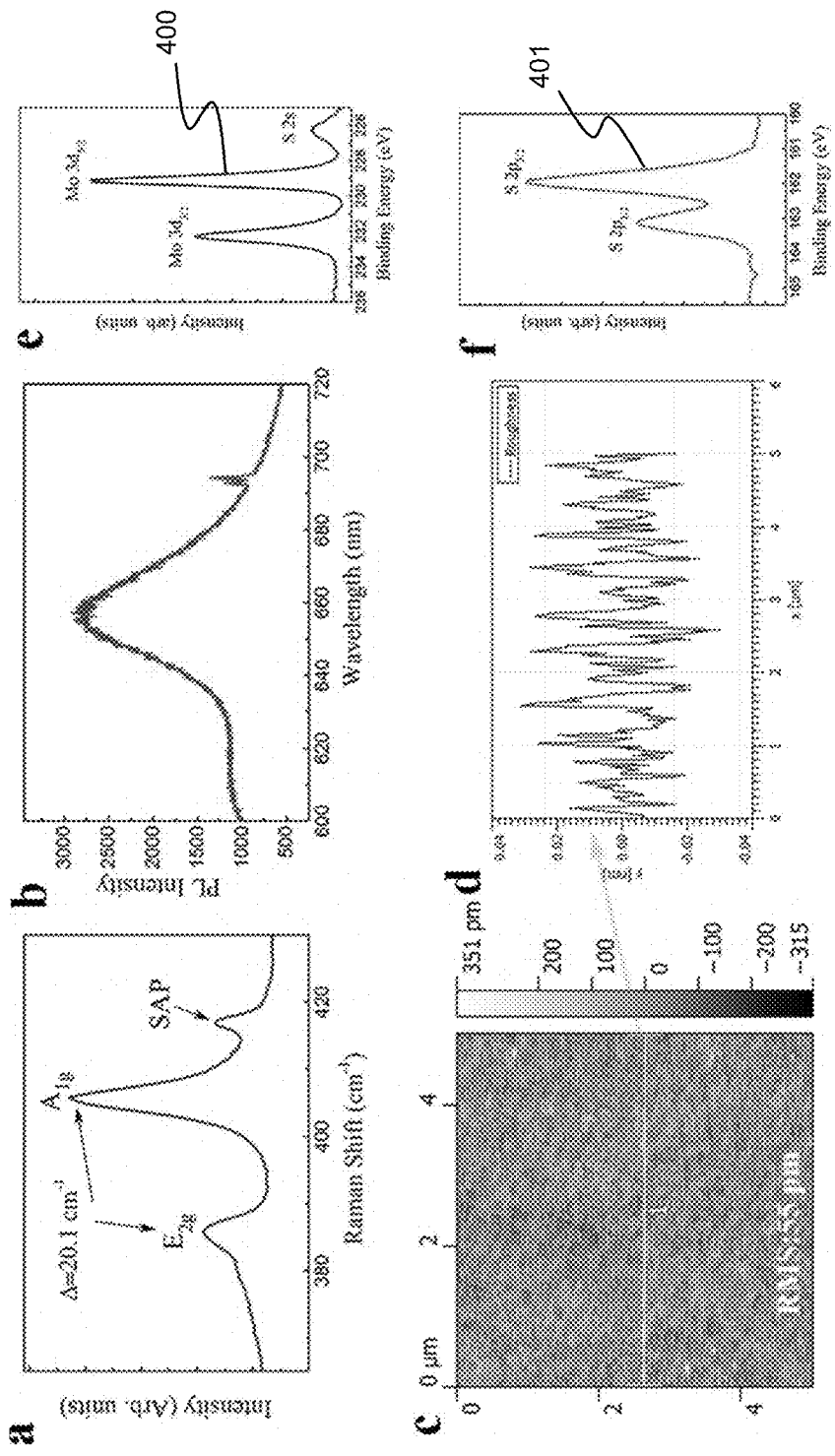
FIG. 4 shows observational and analytical results of a $MoS_2$ film monolayer grown using the system of FIG. 1 on a sapphire substrate.

FIG. 4 shows observational and analytical results of $MoS_2$ monolayer film grown using the system 100 of FIG. 1 on a sapphire (SAP) substrate. FIGS. 4a and 4b are the Raman and photoluminescence (PL) spectroscopy for the $MoS_2$ grown on the SAP substrate, respectively. The relative shift between $A_{1g}$ and $E_{2g}$ peaks in the Raman spectra is about 20.1 $cm^{-1}$, close to CVD grown $MoS_2$ monolayer on SAP. The Full Width at Half Maximum (FWHM) of the $E_{2g}$ peak is small, indicating good crystalline quality of the $MoS_2$ monolayer. The PL intensity for the grown $MoS_2$ monolayer on SAP is strong, the peak position of which is related with an optical band gap of 1.89 eV. FIGS. 4c and 4d are the surface morphology and cross-section height from AFM measurement, respectively, which show a uniform and ultra-flat $MoS_2$ monolayer. Very distinctive separation of the S 2p and Mo 3d split shown in the XPS spectra 400 and 401 in FIGS. 4e and 4f implies that the $MoS_2$ film is in a highly textured structure, which is well consistent with the AFM observation.

As described above, the present system and method can also be extended to grow 2D heterostructures or 2D semiconducting alloy materials by using different materials for the first electrode 102 (tube target) and second electrode 104 (rod). For example, it is possible to use Mo metal as the first electrode 102 and a W metal rod as the second electrode 104. If the positive voltage is applied on the W electrode, a $MoS_2$ film can be grown. Then, if the positive voltage is applied on the Mo electrode, a $WS_2$ film can be grown on the $MoS_2$ film, realizing a $WS_2/MoS_2$ heterostructure. This way to grow 2D heterostructures by sputtering is in-situ, and much less complex than conventional methods because the same hardware set-up can be used.

Figure 5:
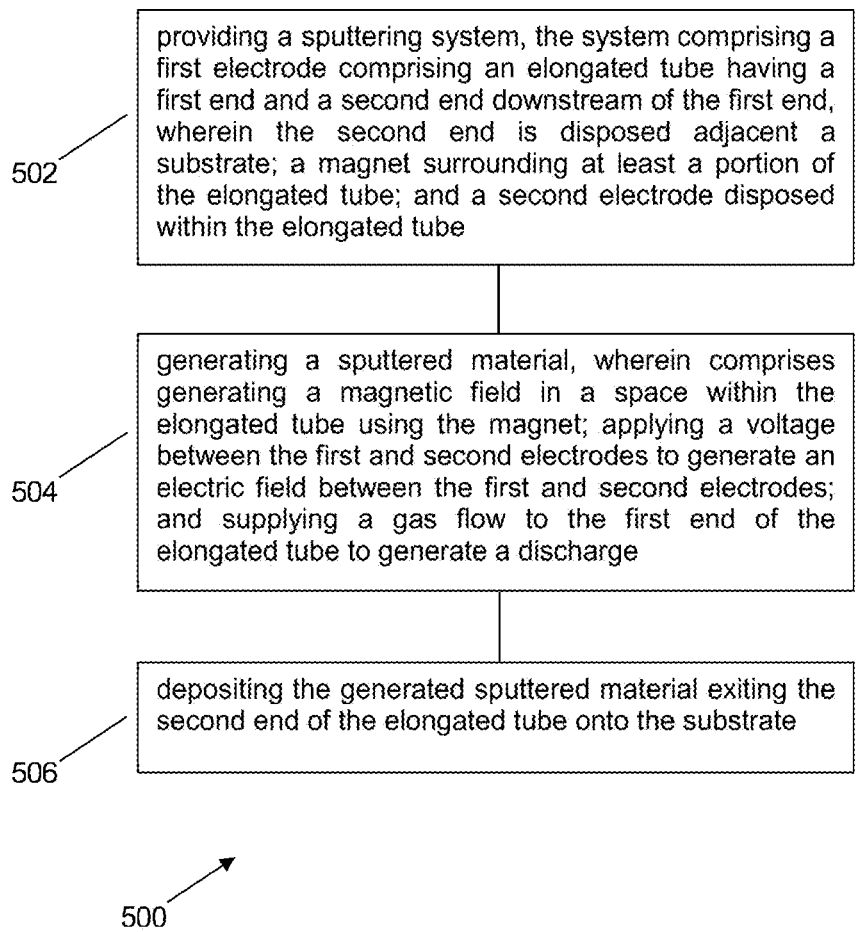
FIG. 5 shows a flow chart illustrating a sputtering method according to an example embodiment.

FIG. 5 shows a flow chart 500 illustrating a sputtering method according to an example embodiment. At step 502, a sputtering system is provided. The system includes a first electrode comprising an elongated tube having a first end and a second end downstream of the first end, wherein the second end is disposed adjacent a substrate; a magnet surrounding at least a portion of the elongated tube; and a second electrode disposed within the elongated tube. At step 504, a sputtered material is generated. Generating the sputtered material comprises generating a magnetic field in a space within the elongated tube using the magnet; applying a voltage between the first and second electrodes to generate an electric field between the first and second electrodes; and supplying a gas flow to the first end of the elongated tube to generate a discharge. At step 506, the generated sputtered material exiting the second end of the elongated tube is deposited onto the substrate.

The sputtering system and method as described in the example embodiments have several advantages including low surface damage and defect density in the grown films, precise thickness control of the grown films, and compatibility with industry mass production. The present system and method can be useful in various industries, for example, optoelectronics and photonics. Example applications include 2D materials growth, 2D materials based heterostructures, ultrathin multi-layer film growth, and nanostructure growth.

It will be appreciated by a person skilled in the art that numerous variations and/or modifications may be made to the present invention as shown in the specific embodiments without departing from the scope of the invention as broadly described. The present embodiments are, therefore, to be considered in all respects to be illustrative and not restrictive.

The invention claimed is:

1. A sputtering system comprising:
a first electrode comprising an elongated tube having a first end and a second end downstream of the first end, wherein the first end is configured to receive a gas flow and the second end is placed next to a substrate;
a magnet surrounding at least a portion of the elongated tube and configured to generate a magnetic field in a space within the elongated tube; and
a second electrode disposed within the elongated tube, wherein the first and second electrodes are made of different materials,
wherein a voltage is configured to be applied between the first and second electrodes to generate an electric field between the first and second electrodes; and
wherein a direction of the electric field between the first and second electrodes is alternated in use for depositing alternating layers of sputtered materials onto the substrate, the sputtered materials comprising the different materials.

2. The sputtering system as claimed in claim 1 wherein at least one of the first and second electrodes is made of a transition metal, and wherein the gas flow comprises a chalcogen vapor.

3. The sputtering system as claimed in claim 2, wherein the transition metal comprises Molybdenum or Tungsten.

4. The sputtering system as claimed in claim 1, wherein the tube is substantially cylindrical and the second electrode comprises a rod disposed along a longitudinal axis of the tube.

5. The sputtering system as claimed in claim 1, further comprising control means for controlling at least one of a partial pressure of the gas flow, a strength of the magnetic field, a strength of the electric field, a sputtering duration, and a temperature of the substrate.

6. A sputtering method comprising:
providing a sputtering system, the system comprising:
a first electrode comprising an elongated tube having a first end and a second end downstream of the first end, wherein the second end is disposed adjacent a substrate;
a magnet surrounding at least a portion of the elongated tube; and
a second electrode disposed within the elongated tube, wherein the first and second electrodes are made of different materials;
generating a sputtered material, wherein generating comprises:
generating a magnetic field in a space within the elongated tube using the magnet;
applying a voltage between the first and second electrodes to generate an electric field between the first and second electrodes; and
supplying a gas flow to the first end of the elongated tube to generate a discharge;
depositing the generated sputtered material exiting the second end of the elongated tube onto the substrate; and
alternating a direction of the electric field between the first and second electrodes for depositing alternating layers of sputtered materials onto the substrate, the sputtered materials comprising the different materials.

7. The sputtering method as claimed in claim 6, wherein providing the sputtering system further comprises selecting at least one of the first and second electrodes to be made of a transition metal, and wherein supplying the gas flow comprises supplying a chalcogen vapor in the gas flow.

8. The sputtering method as claimed in claim 7, wherein the transition metal comprises Molybdenum or Tungsten.

9. The sputtering method as claimed in claim 6, wherein providing the sputtering system further comprises providing a substantially cylindrical tube and disposing a rod along a longitudinal axis of the tube.

10. The sputtering method as claimed in claim 6, further comprising controlling at least one of a partial pressure of the gas flow, a strength of the magnetic field, a strength of the electric field, a sputtering duration, and a temperature of the substrate.

11. The sputtering method as claimed in claim 6, wherein depositing the generated sputtered material comprises depositing the material as a two-dimensional (2D) film.

12. The system as claimed in claim 3, wherein the first electrode comprises Molybdenum (Mo), the second electrode comprises Tungsten (W), and the chalcogen vapor comprises Sulfur (S) vapor, and wherein the alternating layers of sputtered materials comprise alternating $WS_2$ and $MoS_2$ layers.

13. The method as claimed in claim 8, wherein the first electrode comprises Molybdenum (Mo), the second electrode comprises Tungsten (W), and the chalcogen vapor comprises Sulfur (S) vapor, and wherein depositing alternating layers of sputtered materials comprises depositing alternating $WS_2$ and $MoS_2$ layers.

* * * * *